United States Patent [19]
Hu

[11] Patent Number: 5,990,708
[45] Date of Patent: Nov. 23, 1999

[54] DIFFERENTIAL INPUT BUFFER USING LOCAL REFERENCE VOLTAGE AND METHOD OF CONSTRUCTION

[75] Inventor: Dan C. Hu, Bellaire, Tex.

[73] Assignee: Texas Instruments Incorporated, Dallas, Tex.

[21] Appl. No.: 09/016,033

[22] Filed: Jan. 30, 1998

Related U.S. Application Data

[60] Provisional application No. 60/037,122, Feb. 3, 1997.

[51] Int. Cl.[6] ........................................ H03K 5/22
[52] U.S. Cl. ................................ 327/68; 327/73; 327/77; 327/89
[58] Field of Search .................................. 327/68, 72, 73, 327/77, 78, 79, 85, 87, 88, 89, 205, 206

[56] References Cited

U.S. PATENT DOCUMENTS

| | | | |
|---|---|---|---|
| 4,438,349 | 3/1984 | Shoji | 327/85 |
| 4,937,476 | 6/1990 | Bazes | 326/71 |
| 4,958,133 | 9/1990 | Bazes | 330/253 |
| 5,640,104 | 6/1997 | Matsubara | 326/34 |
| 5,736,871 | 4/1998 | Goto | 326/115 |
| 5,801,553 | 9/1998 | Danstrom | 327/67 |

*Primary Examiner*—Kenneth B. Wells
*Assistant Examiner*—Hai L. Nguyen
*Attorney, Agent, or Firm*—Robby T. Holland; W. James Brady; Richard L. Donaldson

[57] ABSTRACT

A differential input buffer (14) and method of construction are provided. The differential input buffer (14) includes a differential amplifier (54, 56, 50, 52, 62, 64) connected to receive an input signal (IN). A local reference voltage generator (68, 70, 72) is connected to the differential amplifier (54, 56, 50, 52, 62, 64) and is connected to receive an external voltage reference (BLR) and to provide a local reference voltage (VREF) to the differential amplifier (54, 56, 50, 52, 62, 64). The local reference generator (68, 70, 72) is adjustable during construction to produce a desired level for the local reference voltage (VREF). The differential input buffer (14) also includes a hysteresis element (66, 74) that is connected to provide feedback to the differential amplifier (54, 56, 50, 52, 62, 64) and includes a buffer stage (76, 78, 80, 82, 84, 86) that is connected to receive an output of the differential amplifier (54, 56, 50, 52, 62, 64) and to drive an output signal (OUT). The buffer stage is also connected to the hysteresis element (66, 74) to provide a basis for the feedback to the differential amplifier (54, 56, 50, 52, 62, 64).

20 Claims, 2 Drawing Sheets

DIFFERENTIAL INPUT BUFFER USING LOCAL REFERENCE VOLTAGE AND METHOD OF CONSTRUCTION

This is a Non Provisional application filed under 35 USC 119(e) and claims priority of prior provisional, Ser. No. 60/037,122 of inventor Dan C. Hu, filed Feb. 3, 1997.

TECHNICAL FIELD OF THE INVENTION

This invention relates in general to the field of electronic circuits, and more particularly to a differential input buffer using a local reference voltage and method of construction.

BACKGROUND OF THE INVENTION

Integrated circuits often include input buffers for receiving input signals and for driving signals to other parts of the integrated circuit. For example, input buffers operate to distinguish between logic low and logic high on the input signal based upon comparison to a reference voltage, and the input buffers then drive internal signals appropriately. Conventional input buffers can require the use of external reference generators that use power and consume space. In addition, some conventional input buffers can have difficulty with accurately distinguishing between logic low and logic high when the input signal is near the level of the reference voltage.

SUMMARY OF THE INVENTION

In accordance with the present invention, a differential input buffer using a local reference voltage and method of construction are provided that provides benefits over previously developed input buffers.

According to one embodiment of the present invention, a differential input buffer and method of construction are provided. The differential input buffer includes a differential amplifier connected to receive an input signal. A local reference voltage generator is connected to the differential amplifier and is connected to receive an external voltage reference and to provide a local reference voltage to the differential amplifier. The local reference generator is adjustable during construction to produce a desired level for the local reference voltage. The differential input buffer also includes a hysteresis element that is connected to provide feedback to the differential amplifier and includes a buffer stage that is connected to receive an output of the differential amplifier and to drive an output signal. The buffer stage is also connected to the hysteresis element to provide a basis for the feedback to the differential amplifier.

A technical advantage of the present invention is better high and low input voltage characteristics. The differential input buffer locally generates a reference voltage, which can be adjusted for individual cases to favor either high or low inputs. An existing on-chip voltage reference, such as the bit line reference (BLR), is used as a voltage reference for generating the reference voltage used by the differential input buffer. Another advantage is that the local generation of the internal reference voltage consumes relatively low current when compared to conventional external reference generators.

A further technical advantage of the present invention is that the differential input buffer, as a whole, uses relatively low power. The differential input buffer also contains a hysteresis element to provide stability when input signals are at voltage levels near the reference voltage generated and used by the input buffer.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
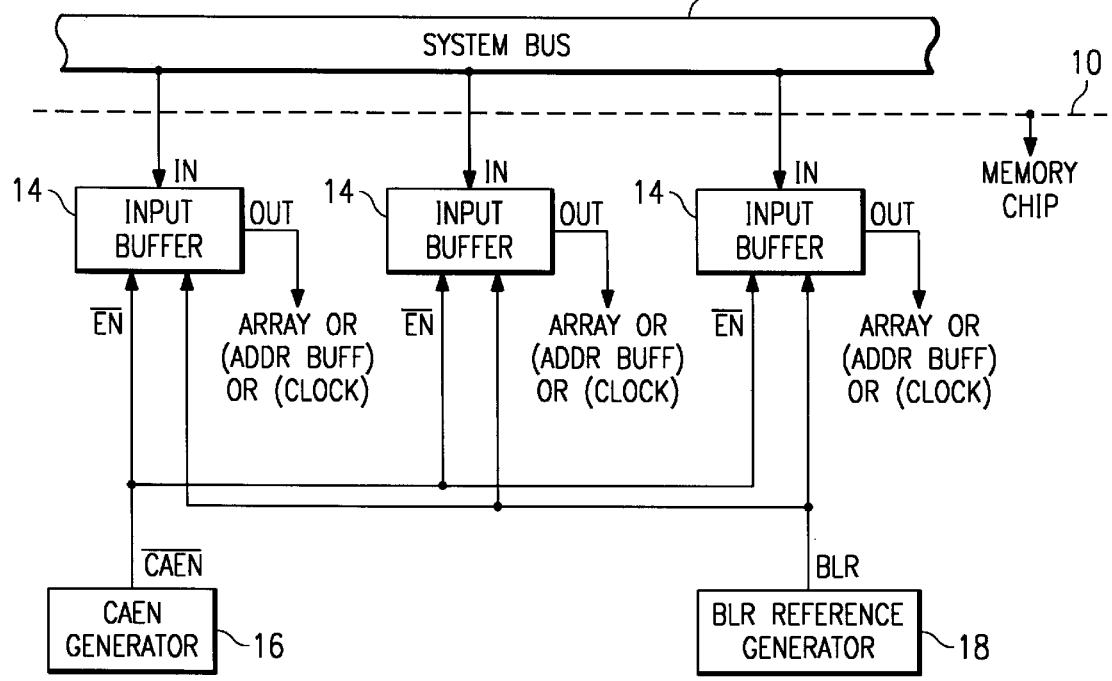
FIG. 1 is a block diagram of one embodiment of an integrated circuit that receives signals using differential input buffers constructed according to the present invention.

FIG. 1 is a block diagram of one embodiment of an integrated circuit, indicated generally at 10, that receives input signals using differential input buffers 14 constructed according to the teachings of the present invention. In the embodiment of FIG. 1, each input buffer 14 receives signals from a system bus 12. Each input buffer 14 also receives an enable signal, $\overline{\text{CAEN}}$, generated by an enable signal generator 16. Each input buffer 14 further receives a reference voltage generated by a reference generator 18. In the embodiment of FIG. 1, reference generator 18 is a bit line reference (BLR) generator in a DRAM device, and the BLR reference voltage is typically one-half the positive power supply, $V_{DD}$. Each input buffer 14 provides an output signal to other parts of integrated circuit 10, such as to a memory array, address buffers, clocks or other circuitry. According to the present invention, each differential input buffer 14 uses an internal reference generator to locally generate a reference voltage. In addition, the reference voltage can be adjusted for individual cases to favor either high or low input voltage levels.

Figure 2:
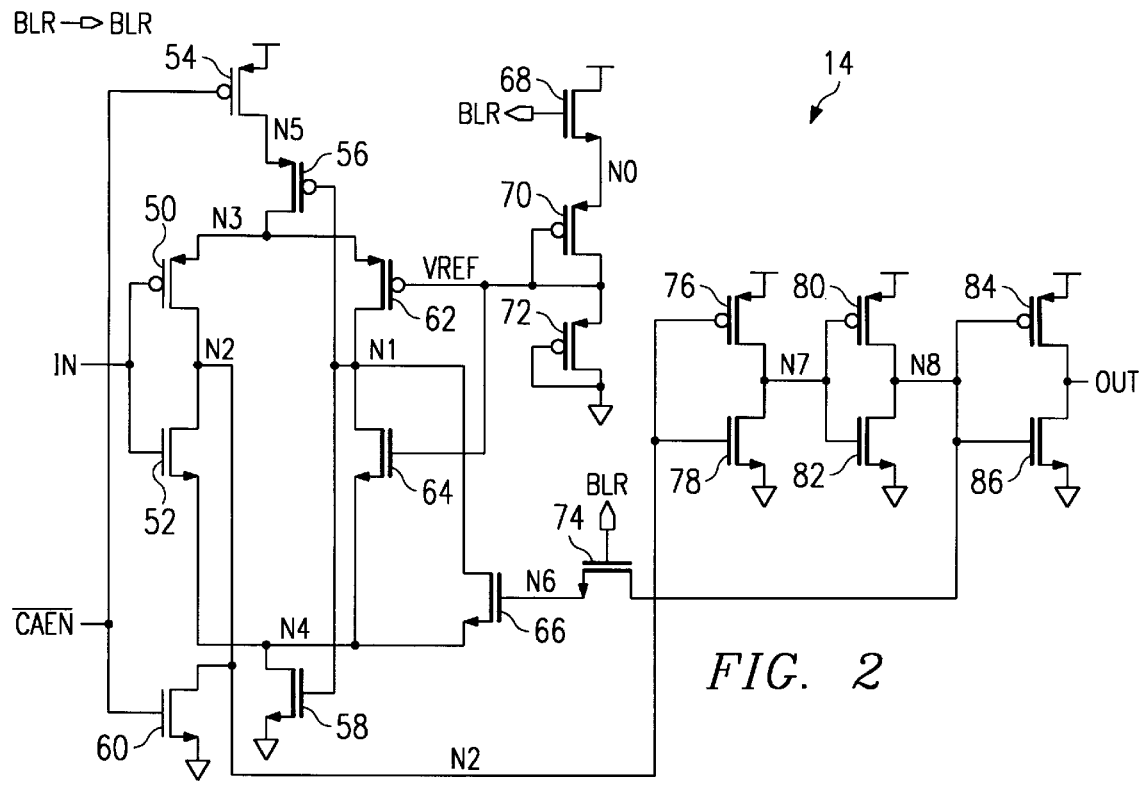
FIG. 2 is a circuit diagram of one embodiment of the differential input buffer of FIG. 1.

FIG. 2 is a circuit diagram of one embodiment of differential input buffer 14 of FIG. 1. As shown, differential input buffer 14 receives the input signal, IN, the enable signal, $\overline{\text{CAEN}}$, and the voltage reference, BLR. The input signal, IN, is provided to a p-channel transistor 50 and an n-channel transistor 52, as shown. A p-channel transistor 54 is connected to the positive power supply and also receives the enable signal, $\overline{\text{CAEN}}$. P-channel transistor 54 is then connected to p-channel transistor 56 which is connected to p-channel transistor 50 and to an n-channel transistor 58. An n-channel transistor 60 is connected to p-channel transistor 50 and n-channel transistor 52 and receives the enable signal $\overline{\text{CAEN}}$, as shown.

A p-channel transistor 62 and an n-channel transistor 64 are connected between p-channel transistor 56 and n-channel transistor 58. The gates of p-channel transistor 62 and n-channel transistor 64 are connected to a locally generated voltage reference, VREF, produced by n-channel transistor 68, p-channel transistor 70 and p-channel transistor 72. The gate of n-channel transistor 66 is connected to n-channel transistor 74 which receives the reference voltage, BLR, at its gate. The drain of n-channel transistor 60 is connected to three output buffer stages, as shown. The first output buffer stage is formed from p-channel transistor 76 and n-channel transistor 78. The second is formed from p-channel transistor 80 and n-channel transistor 82, and the third is formed from p-channel transistor 84 and n-channel transistor 86. The output of differential input buffer 14 is then provided as the output signal, OUT.

Figure 3:
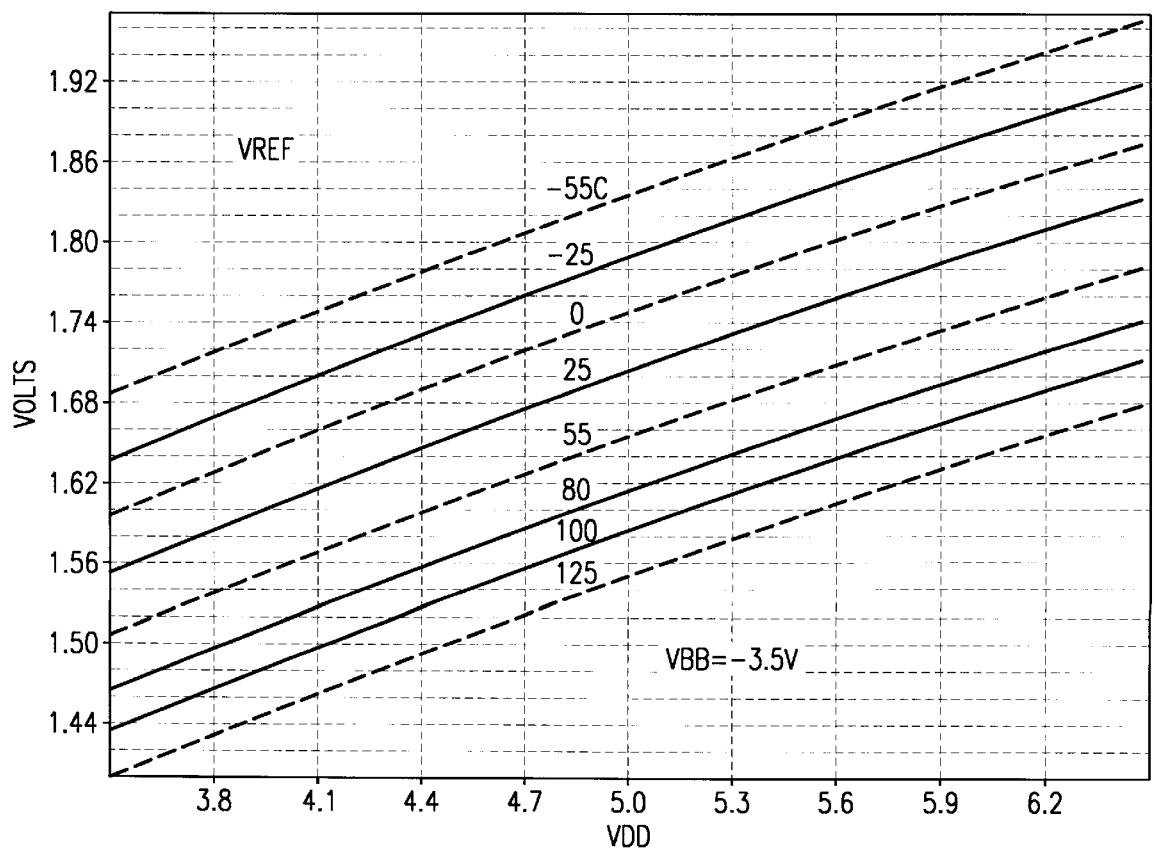
FIG. 3 is a plot showing one embodiment of change in the reference voltage generated by the differential input buffer of FIG. 2.

As can be seen, differential input buffer 14 of FIG. 3 has essentially three parts: a local reference voltage generator formed by transistors 68, 70, and 72; an amplifier formed by transistors 54, 56, 50, 52, 62, and 64; and a hysteresis element formed by transistors 66 and 74. The local reference voltage generator produces the reference voltage, VREF, which is adjustable and determined by the threshold voltage, $V_{TP}$, of transistor 72. The node, NO, has a voltage level at a voltage close to the voltage reference, BLR, minus the threshold voltage, $V_{TP}$. As mentioned above, the voltage reference, BLR, is one of the inputs to input buffer 14 and, in one embodiment, BLR is approximately half the voltage of the power supply, $V_{DD}$.

At lower input voltages, the node, NO, will be at a voltage level that is less than VREF. As a result, the gate voltage for device 70 will be greater than the threshold voltage, $V_{TP}$, of transistor 72. Therefore transistor 70 will operate in its cut-off region. When the gate voltage (which is equal to VREF less the voltage level of the node, NO) reaches the threshold voltage, $V_{TP}$, or less, transistor 70 will begin to turn-on. Due to coupling effects of parasitic capacitances of the nodes of differential amplifier to VREF, transistor 70 will act as a stabilizer, keeping VREF close to the initial voltage.

The amplifier portion of the circuit receives the enable signal, $\overline{\text{CAEN}}$. In this embodiment, if the enable signal, $\overline{\text{CAEN}}$, is high, it indicates that the integrated circuit 10 is disabled. If the enable signal, $\overline{\text{CAEN}}$, is low, then differential input buffer 14 will sense the level of the input signal, IN, relative to the reference voltage, VREF, and determine what the output will be. The reference voltage, VREF, comes from the local reference generator described above and is connected to the gates of transistor 62 and 64. As can be seen, transistors 62 and 64 make an inverter that drives the node, N1, to a voltage level dependent upon the voltage of VREF.

As an example, TTL input levels are typically 2.4 volts and 0.8 volts for high and low signals. In a TTL environment, for differential input buffer 14 to sense effectively, the level of reference voltage, VREF, should be close to the average of these two values. In the illustrated embodiment, VREF varies between 1.49 volts and 1.9 volts. As a result of this relatively low voltage level for VREF, p-transistor 62 will turn on more than does transistor 64. In other words, transistor 62 passes more current than transistor 64. Also, the node, N1, will be close to the value of the node, N3. The node, N1, is also driving transistor 56, which causes transistor 56 not to be turned on as much. As a result, the node, N3, will not be at a full $V_{DD}$. Conversely, because the voltage of the node, N1, is closer to $V_{DD}$ than it is to ground potential, transistor 58 will be turned on sufficiently to pull the node, N4, all the way to ground potential.

Compared to CMOS voltage levels, the TTL input level of 2.4 volts is relatively low. Therefore, by favoring transistor 58 with a high voltage on the node, N1, the input buffer effectively favors reading a logic high. For example, the TTL input of 2.4 volts would be sensed as a logic high at the output of input buffer 14. When the TTL input is low, that is, less than approximately 1.4 volts, transistor 52 will be very close to the cutoff region of operation, and transistor 50 will pull the node, N2, high and therefore the output would be a logic low.

The hysteresis element of input buffer 14 includes transistor 66 which is controlled by the node, N6, through transistor 74. Transistor 74 limits the voltage of the node, N6, to the voltage reference, BLR, less the threshold voltage, $V_{TP}$, of transistor 72 when the node, N6, is high. Also when the node, N6, is high, transistor 66 will be partially on and help the reference side of the differential input buffer 14 pull the node, N1, lower. When the node, N8, is low, transistor 66 is off. This effectively produces what is known as a hysteresis effect. Depending on what state the differential input buffer 14 is in initially, it will react differently to inputs. If the node, N6, is high initially, then a slightly higher input level can be applied at the input node, IN, to switch the differential input buffer 14. Once switched, a lower level can be applied at the input node, IN, to switch the amplifier back the other way. Effectively, a buffer zone is created where differential input buffer 14 does not switch. If the hysteresis element were not there, the differential input buffer 14 could start oscillating when the input node, IN, is sitting at the exact reference voltage, VREF, and the differential amplifier can go either way.

FIG. 3 is a plot showing the change in the reference voltage, VREF, with temperature giving a $V_{BB}$ of −3.5 volts and the $V_{DD}$ shown. This plot shows how the transistor 72 is essentially programmable to adjust the threshold voltage level of that transistor. By adjusting the threshold voltage of transistor 72, the reference voltage, VREF, produced and supplied to transistor 62 and transistor 64 is modified according to the drawing in FIG. 3. FIG. 3 shows the results when transistor 72 having width of 10 and a length of 2. According to the present invention, the width of transistor 72 is adjustable from 2 to 10 and the length is adjustable from 0.9 to 2. It should be understood, however, that other values could be used in accordance with the present invention.

Figure 4:
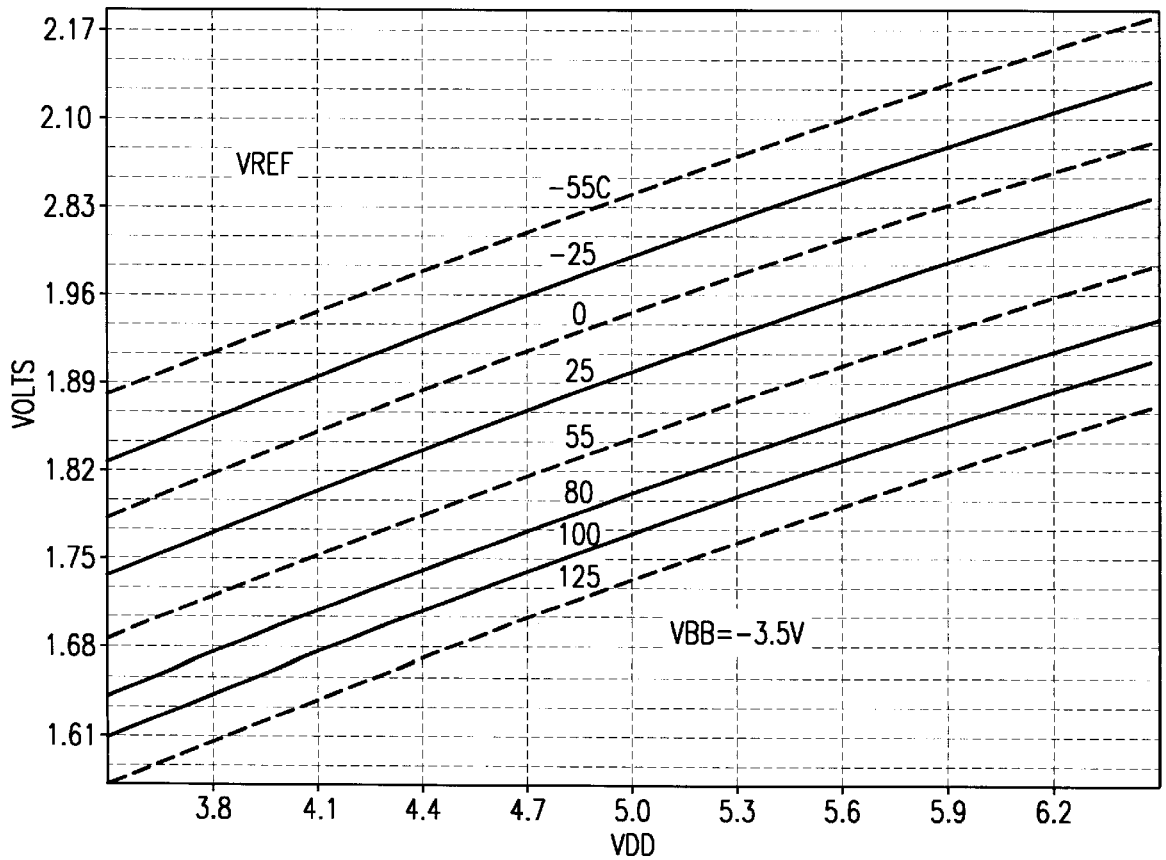
FIG. 4 is a plot showing another embodiment of change in the reference voltage generated by the differential input buffer of FIG. 2.

FIG. 4 shows a plot of the change in the reference voltage, VREF, for a $V_{BB}$ of −3.5 volts and for changing $V_{DD}$, as shown. The values shown in FIG. 4 are for transistor 72 having a width of 4 and a length of 1.4. As can be seen in comparison with FIG. 3, the value for the reference voltage, VREF, has increased at the same temperature. The adjustability of transistor 72 is important to ensuring that the output of the differential input buffer 14 has the appropriate levels based upon the inputs received.

Although the present invention has been described in detail, it should be understood that various changes, substitutions and alterations can be made thereto without departing from the spirit and scope of the invention and is defined by the appended claims.

What is claimed is:

1. An integrated circuit, comprising:
   a plurality of differential input buffers, each differential input buffer comprising:
      a differential amplifier connected to receive an input signal received by the integrated circuit;
      a local reference voltage generator connected to the differential amplifier, the local reference voltage generator also connected to receive an external voltage reference and to provide a local reference voltage to the differential amplifiers;
      a hysteresis element connected to provide feedback to the differential amplifier; and
      a buffer stage connected to receive an output of the differential amplifier and to drive an output signal, the buffer stage also connected to the hysteresis element to provide a basis for the feedback to the differential amplifier;
   a reference generator operable to generate and provide the external voltage reference; and additional circuitry connected to receive the output signal of each differential input buffer and to use the external voltage reference generated by the reference generator.

2. The integrated circuit of claim 1, wherein the differential amplifier of each differential input buffer comprises a plurality of CMOS transistor devices interconnected to form the differential amplifier.

3. The integrated circuit of claim 1, wherein the local reference voltage generator of each differential input buffer comprises:
   an n-channel transistor having a drain connected to a positive power supply, a source connected to a first node, and a gate connected to receive the external voltage reference;
   a p-channel transistor having a source connected to the first node, a drain connected to a second node, and a gate connected to the second node; and
   a second p-channel transistor having a source connected to the second node, a drain connected to ground potential and a gate connected to ground potential;
   the second node connected to the differential amplifier and providing the local reference voltage.

4. The integrated circuit of claim 3, wherein the second p-channel transistor of each differential input buffer has a width and length that is adjustable during construction to change the threshold voltage and to produce different levels for the local reference voltage.

5. The integrated circuit of claim 1, wherein the hysteresis element of each differential input buffer comprises:
   a first n-channel transistor having a source connected to a first node of the differential amplifier and a drain connected to a second node of the differential amplifier; and
   a second n-channel transistor having a source connected to the gate of the first n-channel transistor, a drain connected to the buffer stage, and a gate connected to the external voltage reference.

6. The integrated circuit of claim 1, wherein the reference generator operable to generate and provide the external voltage reference comprises a BLR reference generator.

7. The integrated circuit of claim 1, wherein the additional circuitry comprises a memory array, address buffers and clock circuitry.

8. A differential input buffer comprising:
   a differential amplifier connected to receive an input signal;
   a local reference voltage generator coupled to the differential amplifier, the local reference voltage generator also connected to receive an external voltage reference, and to provide a local reference voltage to the differential amplifier;
   a buffer stage connected to receive an output of the differential amplifier and to drive an output signal;
   a hysteresis element connected to provide feedback to the differential amplifier, the hysteresis element comprising:
      a first transistor having a source coupled to a first node of the differential amplifier and a drain coupled to a second node of the differential amplifier; and
      a second transistor having a gate connected to receive the external voltage reference and having its source-to-drain path connected between the gate of the first transistor and the buffer stage.

9. The differential input buffer of claim 8, wherein the differential amplifier comprises a plurality of CMOS transistor devices interconnected to form the differential amplifier; and
   wherein the input signal is connected to the gate of an n-channel transistor and the gate of a p-channel transistor within the differential amplifier and the local reference voltage is connected to the gate of an n-channel transistor and the gate of a p-channel transistor within the differential amplifier.

10. The differential input buffer of claim 8, wherein the local reference voltage generator comprises:
    an n-channel transistor having a drain connected to a positive power supply, a source connected to a first node, and a gate connected to receive the external voltage reference;
    a p-channel transistor having a source connected to the first node, a drain connected to a second node, and a gate connected to the second node; and
    a second p-channel transistor having a source connected to the second node, a drain connected to ground potential and a gate connected to ground potential;
    the second node connected to the differential amplifier and providing the local reference voltage.

11. The differential input buffer of claim 10, wherein the second p-channel transistor has a width and length that is adjustable during construction to change the threshold voltage and to produce different levels for the local reference voltage.

12. The differential input buffer of claim 8, wherein the external voltage reference comprises a BLR voltage reference.

13. A method of constructing a differential input buffer in an integrated circuit, comprising:
    connecting a differential amplifier to receive an input signal;
    connecting a local reference voltage generator to the differential amplifier to provide a local reference voltage to the differential amplifier, and connecting the local reference voltage generator to receive an external voltage reference, the external voltage reference being generated external to the differential input buffer but within the integrated circuit,
    connecting a hysteresis element to provide feedback to the differential amplifier; and
    connecting a buffer stage to receive an output of the differential amplifier and to drive an output signal, and connecting the buffer stage to the hysteresis element to provide a basis for the feedback to the differential amplifier.

14. The method of claim 13, wherein the local reference voltage generator is constructed by:
    connecting a drain, source and gate of an n-channel transistor such that the drain is connected to a positive power supply, the source is connected to a first node, and the gate is connected to receive the external voltage reference;
    connecting a source, drain and gate of a p-channel transistor such that the source is connected to the first node, the drain is connected to a second node, and the gate connected to the second node;
    connecting a source, drain and gate of a second p-channel transistor such that the source is connected to the second node, the drain is connected to ground potential and the gate is connected to ground potential; and connecting the second node to the differential amplifier to provide the local reference voltage.

15. The method of claim 14 wherein the local reference generator is adjustable during construction to produce a desired level for the local reference voltage; and wherein adjusting the local reference generator is accomplished by adjusting a width and length of the second p-channel transistor during construction.

16. The method of claim 13 further comprising:

providing the output signal to additional circuitry, the additional circuitry also connected to use the external voltage reference.

17. The method of claim 13 wherein the external voltage reference comprises a bit line reference.

18. The method of claim 16, wherein the additional circuitry comprises a memory array, address and clock circuitry.

19. The differential input buffer of claim 8, wherein the first and second transistors are n-channel transistors.

20. The differential input buffer of claim 8 wherein the first transistor is connected in parallel with a transistor in the differential amplifier, the transistor in the differential amplifier having its gate connected to receive the local reference voltage.

* * * * *